United States Patent [19]

Shimizu

[11] Patent Number: 4,535,227
[45] Date of Patent: Aug. 13, 1985

[54] METHOD FOR HEATING SEMICONDUCTOR WAFER BY MEANS OF APPLICATION OF RADIATED LIGHT

[75] Inventor: Hiroshi Shimizu, Yokohama, Japan

[73] Assignee: Ushio Denki Kabushiki Kaisha, Tokyo, Japan

[21] Appl. No.: 538,934

[22] Filed: Oct. 4, 1983

[51] Int. Cl.³ ............... F27D 11/02; C23C 13/08; H05B 1/00
[52] U.S. Cl. .................. 219/411; 219/354; 219/405; 118/725
[58] Field of Search ............ 219/405, 411, 354; 118/724, 725, 728, 50.1

[56] References Cited

U.S. PATENT DOCUMENTS

| | | | |
|---|---|---|---|
| 3,471,326 | 10/1969 | Kappelmeyer | 118/725 |
| 3,539,759 | 11/1970 | Spiro | 118/725 |
| 3,836,751 | 9/1974 | Anderson | 219/411 |
| 4,101,759 | 7/1978 | Anthony | 219/405 |
| 4,113,547 | 9/1978 | Katz | 118/725 |
| 4,339,645 | 7/1982 | Miller | 118/50.1 |

*Primary Examiner*—Roy N. Envall, Jr.
*Assistant Examiner*—Teresa J. Walberg
*Attorney, Agent, or Firm*—Ziems, Walter & Shannon

[57] ABSTRACT

When heating a semiconductor wafer by means of application of radiated light, a subsidiary heating device which is arranged in contact with the surface of a circumferential edge or a surface portion lying in the vicinity of the circumferential edge of the semiconductor wafer is employed to additionally heat or to preheat the circumferential portion of the wafer so as to make the temperature of the wafer uniform across the entire surface thereof. Use of such subsidiary heating device is effective to prevent the occurrence of such large "warping" as to impair subsequent treatment and/or processing or the development of "slip line".

15 Claims, 4 Drawing Figures

METHOD FOR HEATING SEMICONDUCTOR WAFER BY MEANS OF APPLICATION OF RADIATED LIGHT

BACKGROUND OF THE INVENTION (1) Field of the Invention

This invention relates to a method for heating a semiconductor wafer by means of application of radiated light.

(2) Description of the Prior Art

The ion implantation process has recently been finding actual utility as an effective method for introducing dopant atoms into a semiconductor wafer (hereinafter "wafer" for the sake of brevity) since it is possible to control accurately the concentration levels of dopant atoms and the depths of resulting junctions. In the ion implantation process, the dopant atoms are ionized and accelerated to high velocity and the wafer is bombarded with the dopant atoms. Whenever the ion implantation process is carried out, it is necessary to subject each resulting wafer to a subsequent heating treatment at about 900° C. or higher so that any crystal defects which have been developed due to changes in crystalline state at the surface of the wafer can be healed to ensured desired surface conditions. This heat treatment must be carried out in a short time period so as to prevent the concentration distribution of the implanted dopant atoms in the depthwise direction of the wafer from changing due to thermal diffusion. Furthermore, there is an outstanding demand for the establishment of a high-speed heating and cooling cycle for wafers in order to improve their productivity.

Reflecting the above-mentioned demands, a novel method has recently been developed to heat wafers by means of application of radiated light. According to this method, the temperatures of wafers may be raised to some hundred degrees above 1000° C. in a time period as short as a few seconds.

It has however been found that, when a wafer, for example, a wafer of a single crystal of silicon, is heated to a treatment temperature of about 1000° C. or so in a short time period of not longer than a few seconds and is then held at that treatment temperature by means of mere application of radiated light so as to carry out its heat treatment, a relatively large temperature difference occurs between the circumferential portion of the wafer and its central portion in the course of the heat-raising and heat treatment step, whereby the wafer develops such large "warping" as to impair subsequent treatment and/or processing steps and also a damage called "slip line" in the wafer.

The thickness of a wafer is generally very small, namely, of a level of about 0.5 mm or so and its thickness temperature distribution is thus rendered substantially uniform in a very short time period of a level of $10^{-3}$ second or so. Accordingly, a wafer is not practically affected adversely by any thicknesswise non-uniform temperature distribution. The above-mentioned "warping" or "slip line" is hence caused by the non-uniform temperature distribution in the direction extending along the surfaces of the wafer. Specifically, the temperature of the wafer is kept considerably lower at its circumferential portion compared with its central portion, because even if the surfaces of the wafer are heated with a uniform radiant energy density by means of application of radiated light, far more heat is allowed to radiate from the circumferential portion of the wafer than its central portion, and the temperature of the circumferential portion of the wafer cannot thus follow that of the central portion of the wafer when the temperature of the wafer is raised, and the former temperature cannot reach the latter temperature even during the heat treatment of the wafer.

If a wafer develops such large "warping", some problems will be encountered in its subsequent treatment and/or processing steps, including for example that a pattern image may be distorted in the photoetching treatment step. On the other hand, the occurrence of "slip line" makes it impossible to use the wafer as a semiconductor material, in other words, destroys its value and, accordingly, leads to a fatal loss.

SUMMARY OF THE INVENTION

With the foregoing in view, the present invention has as its object the provision of a heating method of a semiconductor wafer by means of application of radiated light without developing such large "warping" as to impair subsequent treatment and/or processing steps of the semiconductor wafer or such a damage as "slip line".

In one aspect of this invention, there is thus provided a method for heating a semiconductor wafer by means of application of light radiated from a light source, which method comprises arranging subsidiary heating means in contact with the surface of a circumferential edge or a surface portion lying in the vicinity of the circumferential edge of the semiconductor wafer; and heating the semiconductor wafer by means of application of light radiated from the light source while additionally heating or after preheating the semiconductor wafer at mainly the portion lying in the vicinity of the circumferential edge by the subsidiary heating means.

The heating method of this invention is effective in improving the uniformity of the temperature distribution on a wafer surface, thereby successfully preventing the occurrence of such large "warping" as to impair subsequent treatment and/or processing steps and such a damage as "slip line". Therefore, the present invention is extremely valuable from the practical viewpoint.

The above and other objects, features and advantages of the present invention will become apparent from the following description and the appended claims, taken in conjunction with the accompanying drawings.

DETAILED DESCRIPTION OF THE INVENTION

Figure 1:
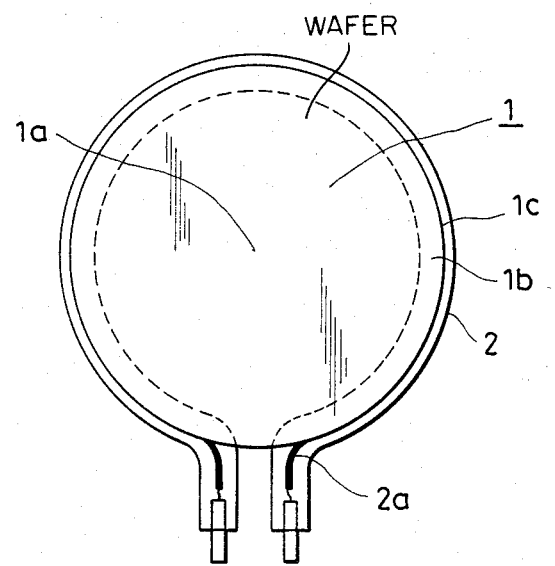
FIG. 1 is a top plan view of a wafer and subsidiary heating means in a state whereby the wafer is heat-treated in accordance with one embodiment of this invention.

Referring now to the drawings, preferred embodiments of this invention will be described.

Figure 2:
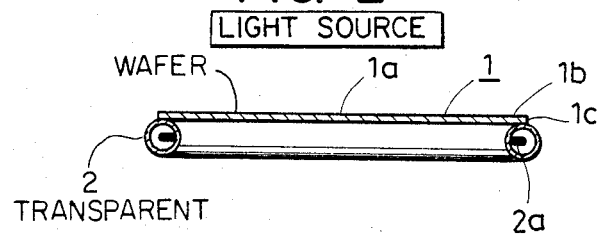
FIG. 2 is a cross-sectional front view of the wafer and subsidiary heating means of FIG. 1.

Reference is first made to FIG. 1 and FIG. 2. Although not shown in the drawings, twelve (12) tubular halogen lamps, each of the power consumption of 600 W, are arranged close to one another in a plane over and parallel to the upper surface of the semiconductor wafer 1 to be heat-treated, thereby forming a plane light source, and another plane light source of the same arrangement of the lamps is also provided underneath and parallel to the lower surface of the wafer 1 so that the wafer can be heated with the same uniform radiant energy density at both upper and lower surfaces thereof to about 1000° C. at central portions 1a of the upper and lower surfaces. In this embodiment, the plane light sources consume in total about 14 KW of electric power for radiation of light. The wafer 1 may for example be a disk having a diameter of 4 inches made of a single crystal of silicon doped with boron in accordance with the ion implantation process.

Numeral 2 indicates ring-shaped subsidiary heating means equipped with an envelope made of silica glass, for example, a ring-shaped halogen lamp or infrared lamp. It is provided with a filament 2a in the envelope. The subsidiary heating means 2 is arranged on the upper or lower surface of the wafer 1 so that the subsidiary heating means 2 is kept in contact with a circumferential edge 1c of the wafer 1 or a surface portion 1b of the wafer 1, said surface portion 1b lying in the vicinity of the circumferential edge 1c. When arranging the subsidiary heating means 2 for example on the lower surface of the wafer 1, the wafer 1 may be mounted directly on the subsidiary heating means 2.

The wafer 1 is additionally heated at its surface portion 1b lying in the vicinity of the circumferential edge 1c by adjusting the electric power to be supplied to the subsidiary heating means 2 for example within the range of 400 W–1300 W and turning on the subsidiary heating means 2 with the thus-controlled electric power, upon heating the wafer 1 by means of application of light radiated from the plane light sources, or prior to heating the wafer 1 in the above manner, so that the temperature of the surface portion 1b lying in the vicinity of the circumferential edge of the wafer 1 becomes substantially equal to that of the tube wall of the subsidiary heating means 2 within the temperature range of about 500° C. and up.

According to the above heating method, the wafer 1 is primarily heated at both upper and lower surfaces thereof as the upper and lower surfaces of the wafer 1 are exposed to light radiated from the upper and lower plane light sources. Since the surface portion 1b lying in the vicinity of the circumferential edge 1c and necessarily the circumferential edge 1c are heated by the subsidiary heating means 2 arranged in contact with the circumferential edge 1c or the surface portion 1b of the wafer 1, the surface portion 1b lying in the vicinity of the circumferential edge 1c is additionally or precedingly heated by the subsidiary heating means 2. As a result, during the main heating conducted by the application of radiated light, the temperature difference between the central portion 1a and the surface portion 1b lying in the vicinity of the circumferential edge 1c of the wafer 1 is rendered extremely small, thereby making the temperature uniform throughout the wafer 1. Consequently, it is possible to avoid the occurrence of such large "warping" as to impair subsequent treatment and/or processing steps and the development of "slip line". As a matter of fact, the central portion 1a of the wafer 1 is heated to about 1000° C. whereas the surface portion 1b lying in the vicinity of the circumferential edge 1c of the wafer 1 reaches about 970° C. or so with the additional heating by the subsidiary heating means. Although the surface portion 1b is still slightly lower in temperature than the central portion 1a, the wafer 1 does not develop such large "warping" as to impair subsequent treatment and/or processing steps and is also free of "slip line". Thus, the wafer 1 can be successfully subjected to the heat treatment. For the sake of comparison, a wafer similar to the wafer 1 was heat-treated in the same manner as in the above embodiment except that the additional heating by means of the subsidiary heating means 2 was not effected. The temperature of the surface portion 1b lying in the vicinity of the circumferential edge 1c of the wafer 1 remained rather cool, specifically, about 600° C., and the wafer 1 developed such large "warping" as to impair subsequent treatment and/or processing steps and the occurrence of "slip line" was observed in the circumference of the wafer 1.

As has been understood from the above embodiment, the present invention is to prevent the occurrence of such large "warping" as to impair subsequent treatment and/or processing steps and "slip line" by keeping the subsidiary heating means in contact with the circumferential edge 1c of the wafer or the surface portion 1b lying in the vicinity of the circumferential edge 1c of the wafer to additionally or precedingly heat principally the surface potion 1b of the wafer so that the temperature difference between the central portion 1a and the surface portion 1b is minimized and the surface temperature of the wafer is kept thoroughly uniform.

Figure 3:
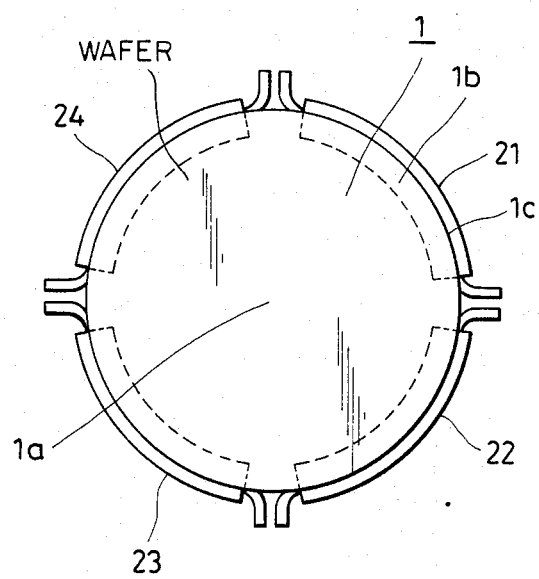
FIG. 3 is a top plan view of a wafer and subsidiary heating means similar to those of FIG. 1 but arranged in accordance with another embodiment of the present invention.
Figure 4:
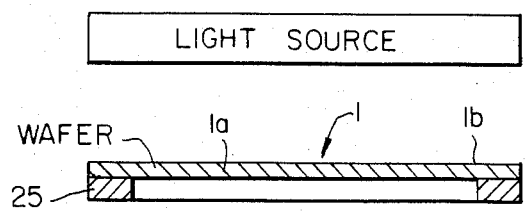
FIG. 4 is a cross-sectional front view of the wafer and an alternate subsidiary heating means.

A specific embodiment of the method according to this invention has been described above. The present invention is however not limited by or to the above embodiment and various modifications and changes may be made thereto. For example, the subsidiary heating means 2 may be provided, as shown in FIG. 3, in a form divided into a plurality of subsidiary heating means, for example, four subsidiary heating means 21, 22, 23, 24 and may be arranged symmetrically in contact with the surface of the circumferential edge 1c of the wafer or the surface portion 1b lying in the vicinity of the circumferential edge 1c of the wafer. These subsidiary heating means 21, 22, 23, 24 may be arranged electrically independent from one another or may alternatively be connected together electrically. Where a plane light source is arranged only above or below the wafer 1, it is preferred to provide the subsidiary heating means 2 on the surface opposite to that facing the plane light source so that the subsidiary heating means 2 does not interfere with light radiated from the plane light source onto the wafer 1. It is feasible to support the wafer 1 and subsidiary heating means 2, respectively, by separate support means. Since the heating of a wafer by means of application of radiated light is generally carried out in an inert gas atmosphere such as argon or in vacuo, the subsidiary heating means is not limited to lamps. It may be feasible to use a resistive heating element or elements made of a high fusing point metal such as a molybdenum heater or heaters having a silicon oxide coating on their surfaces, any one of which is represented by the numeral 25 in FIG. 4. As examples of thermic ray radiating lamps which are useful as the subsidiary heating means in the practice of this invention, may be mentioned halogen lamps and infrared lamps.

Having now fully described the invention, it will be apparent to one of ordinary skill in the art that many changes and modifications can be made thereto without departing from the spirit or scope of the invention as set forth herein.

What is claimed is:

1. A method for heating a semiconductor wafer having a surface by means of application of light radiated from a light source, which method comprises arranging subsidiary heating means in contact with at least one of the surface of a circumferential edge and a surface portion lyin in a vicinity of the circumferential edge of the semiconductor wafer; and heating the semiconductor wafer by means of application of light radiated from the light source while additionally heating the semiconductor wafer principally at the surface portion lying in the vicinity of the circumferential edge by the subsidiary heating means.

2. A method as claimed in claim 1, wherein the subsidiary heating means comprises at least one thermic ray radiating lamp.

3. A method as claimed in claim 2, wherein said at least one thermic ray radiating lamp is a halogen lamp.

4. A method as claimed in claim 2, wherein said at least one thermic ray radiating lamp is an infrared lamp.

5. A method as claimed in claim 1, wherein the subsidiary heating means comprises at least one resistive heating element made of a high fusing point metal.

6. A method as claimed in claim 5, wherein said high fusing point metal is molybdenum.

7. A method as claimed in claim 1, wherein the semiconductor wafer has been pretreated by an ion implantation process.

8. A method for heating a semiconductor wafer having a surface by means of application of light radiated from a light source, which method comprises arranging subsidiary heating means in contact with at least one of the surface of a circumferential edge and a surface portion lying in a vicinity of the circumferential edge of the semiconductor wafer; and heating the semiconductor wafer by means of application of light radiated from the light source after preheating the semiconductor wafer at the surface portion lying in the vicinity of the circumferential edge by the subsidiary heating means.

9. A method as claimed in claim 8, wherein the subsidiary heating means comprises at least one thermic ray radiating lamp.

10. A method as claimed in claim 9, wherein said at least one thermic ray radiating lamp is a lamp.

11. A method as claimed in claim 9, wherein said at least one thermic ray radiating lamp is an infrared lamp.

12. A method as claimed in claim 8, wherein the subsidiary heating means comprises at least one resistive heating element made of a high fusing point metal.

13. A method as claimed in claim 12, wherein said high fusing point metal is molybdenum.

14. A method as claimed in claim 8, wherein the semiconductor wafer has been pretreated by an ion implantation process.

15. A method for heating by means of application of light radiated from a light source a semiconductor wafer having a central surface portion, a circumferential edge surface portion, and a surface portion lying in a vicinity of the circumferential edge surface portion, comprising applying heat from the light source to all of said surface portions of the semiconductor wafer; and applying heat from a subsidiary heat generating means principally to one of said circumferential edge surface portion and said surface portion lying in a vicinity of the circumferential edge surface portion in order to prevent temperature differentials among said surface portions.

* * * * *